US 6,729,018 B1

(12) United States Patent
Takano et al.

(10) Patent No.: US 6,729,018 B1
(45) Date of Patent: May 4, 2004

(54) APPARATUS FOR MOUNTING COMPONENTS

(75) Inventors: Ken Takano, Kadoma (JP); Muneyoshi Fujiwara, Katano (JP); Seiichi Mogi, Utsunomiya (JP); Kurayasu Hamasaki, Katano (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/654,043

(22) Filed: Sep. 1, 2000

(30) Foreign Application Priority Data

Sep. 3, 1999 (JP) ............................................ 11-249411

(51) Int. Cl.⁷ ................................................. H05K 3/30
(52) U.S. Cl. .............................. 29/743; 29/740; 29/739; 29/564.1; 29/832
(58) Field of Search ........................ 29/740, 739, 743, 29/742, 564, 33 M, 832, DIG. 44, 833, 564.1; 414/737, 752; 294/64.1

(56) References Cited

U.S. PATENT DOCUMENTS

| 4,706,187 A |   | 11/1987 | Arai et al. ................... 364/191 |
| 5,033,185 A | * | 7/1991 | Hidese ......................... 29/740 |
| 5,070,598 A | * | 12/1991 | Itagaki et al. .................. 29/705 |
| 5,235,164 A | * | 8/1993 | Noyama et al. ............. 235/375 |
| 5,255,429 A | * | 10/1993 | Nishi et al. ................... 29/720 |
| 5,379,514 A |   | 1/1995 | Okuda et al. ................. 29/833 |
| 5,579,572 A |   | 12/1996 | Kashiwagi et al. ........... 29/836 |
| 5,588,195 A | * | 12/1996 | Asai et al. .................. 29/33 M |
| 5,749,142 A | * | 5/1998 | Hanamura ................... 29/833 |
| 5,908,282 A | * | 6/1999 | Onodera ..................... 414/783 |
| 6,002,650 A | * | 12/1999 | Kuribayashi et al. .. 367/468.24 |
| 6,178,626 B1 | * | 1/2001 | Hada et al. .................. 29/833 |
| 6,259,966 B1 | * | 7/2001 | Izumida et al. ............. 700/229 |
| 6,289,582 B1 | * | 9/2001 | Maenishi et al. ............. 29/832 |

FOREIGN PATENT DOCUMENTS

| EP | 1081998 | * | 7/2001 |
| JP | 03-149603 |   | 6/1991 |
| JP | 2001 119196 | * | 4/2001 |

* cited by examiner

Primary Examiner—Carl J. Arbes
Assistant Examiner—Minh Trinh
(74) Attorney, Agent, or Firm—Parkhurst & Wendel, L.L.P.

(57) ABSTRACT

Apparatus for mounting components, even if the components have narrow inter-component distances, without producing any interference between already mounted components and suction nozzles or components being suction-hold by the suction nozzles. The component mounting apparatus for picking up electronic components supplied from a component supply section by suction nozzles attached to a mounting head and mounting electronic components on a printed circuit board, includes a control section containing information relating to components to be mounted and controlling, based on this information, the positions of the suction nozzle, the mounting head and the printed circuit board so that components to be mounted are mounted in ascending order of height.

4 Claims, 13 Drawing Sheets

APPARATUS FOR MOUNTING COMPONENTS

FIELD OF THE INVENTION

The present invention relates to a method and an apparatus for mounting components, which picks up components supplied from a component supply section using suction nozzles attached to a mounting head and mounts the components on a printed circuit board.

BACKGROUND OF THE INVENTION

Generally, a component mounting apparatus is configured in such a way as to carry a printed circuit board to be mounted using a transfer belt, position the printed circuit board by moving a component mounting section in X and Y directions, pick up components supplied by a component supply section using suction nozzles attached to a mounting head and mount the components on the positioned printed circuit board.

When components are mounted on a printed circuit board, in order to shorten a total time of mounting the components, the electronic components to be mounted are separated into a plurality of component groups according to the sizes, weights and mounting positions of the components supplied, and their mounting order is optimized before the components are mounted. This is because when the components to be mounted are suction-held by suction nozzles and moved to their mounting positions on the printed circuit board, the components may fall off from the suction nozzles if they are big or heavy.

By the way, with reduction in size and weight of electronic devices such as cellular phones and small digital video cameras in recent years, it is necessary to mount components one side of which is smaller than 1 mm with narrow inter-component distances of 0.3 mm or even narrower 0.1 mm, for example.

However, as shown in FIG. 13a, in the case where components are mounted with a narrow inter-component interval α, a component 1a which is already mounted, and a suction nozzle 5 or a component 1b held by the suction nozzle 5 interfere with each other in the vicinity of an arrow C, causing a problem of rendering the mounting of the component 1b defective.

As a solution to such a problem, a method of mounting components using suction nozzles 5 having a smaller diameter as shown in FIG. 13b is proposed. However, such narrow suction nozzles 5 have a problem of failing to keep the nozzle strength and easily getting damaged. Therefore, the diameter of the suction nozzles 5 is required to be at least 4 mm from the standpoint of strength.

SUMMARY OF THE INVENTION

The present invention has been implemented to solve the above described problems and it is an object of the present invention to provide a method and an apparatus for mounting components, capable of mounting even such components as with a narrow inter-component space without producing any interference between the components already mounted and the suction nozzles or components being suction-held by the suction nozzles.

The component mounting apparatus of the present invention is an apparatus that can pick up components supplied from a component supply section by suction nozzles attached to a mounting head and mount the components on a printed circuit board in ascending order of height based on information on the components to be mounted, thus avoiding interference between components or between components and the nozzles. Therefore, in order to mount components in ascending order of height based on information on the components to be mounted, the present invention provides a control section that moves at least one of the positions of the suction nozzle, the mounting head and the printed circuit board.

Furthermore, the component mounting apparatus of the present invention includes a component supply section, a mounting head having suction nozzles, a component mounting section that positions and fixes the printed circuit board, a control section that controls the suction head, the mounting head and the component mounting section, and a data section having component information, wherein the positions of the suction nozzles, the mounting head and the printed circuit board are driven and controlled such that the components are mounted in ascending order of height based on height data of the components supplied from the data section.

Furthermore, the component mounting apparatus of the present invention includes a component supply section, a mounting head having suction nozzles, a component mounting section that positions and fixes the printed circuit board, a control section that controls vertical movements of the suction head and horizontal movements of the mounting head and a data section having component information, and drives and controls the movements of the suction nozzles and the mounting head such that the components are mounted in ascending order of height based on height data of the components supplied from the data section.

The component mounting method of the present invention is a method that, when picking up components supplied from a component supply section by suction nozzles attached to a mounting head and mounting the components on a printed circuit board, drives the positions of the suction nozzle, the suction head and the printed circuit board so that the components are mounted in ascending order of height based on preset internal information on the components to be mounted.

According to the present invention, it is possible to mount components on the printed circuit board without problems because even when components are mounted with only a narrow distance between components, interference in terms of height between the already mounted lower components and the suction nozzles or higher components being suction-held by the suction nozzles is avoided.

In the case where a distance between components to be mounted varies, the component mounting method of the present invention separates components into a plurality of groups in such a way that components with a narrower inter-component distance than a predetermined value are put into a same group and components of the same group are mounted in ascending order of height.

This configuration not only prevents interference between components but also prevents components from being mounted in such an order that mounting of a component of a first group is immediately followed by mounting of another component of a second group whose inter-component distance is longer than that of the first group, thus making it possible to prevent the moving distance of the components to be mounted from becoming too long and finish the overall mounting in a relatively short time.

Furthermore, in case where the distance between neighboring components is narrow, the component mounting method of the present invention checks, according to a mounting plan, whether there are any low components to be mounted first and if there are such components, checks whether such components have actually been mounted or not, and then mounts the components on the printed circuit board.

Even if mounting fails, this configuration allows components to be mounted without producing any interference between the already mounted components and the suction nozzles or components being suction-held by the suction nozzles.

DESCRIPTION OF THE EMBODIMENTS

With reference now to FIG. 1 to FIG. 12, embodiments of the present invention will be explained in detail below.

Figure 13A:
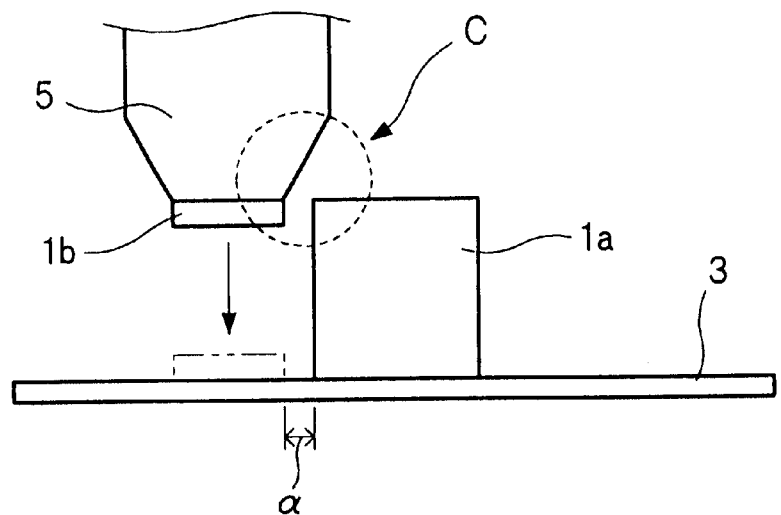
FIGS. 13a and 13b are schematic diagrams of a conventional component mounting process.
Figure 13B:
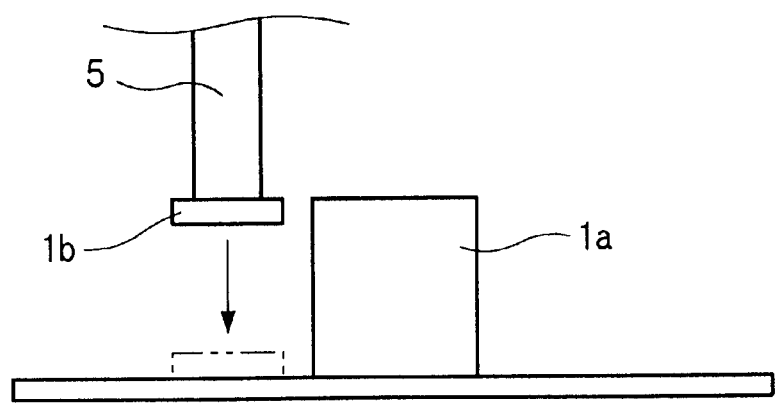

The components similar to those in FIG. 13 illustrating the conventional example above will be explained with the same reference numerals assigned.

(Embodiment 1)

FIG. 1 to FIG. 4 show Embodiment 1 of the present invention.

Figure 1:
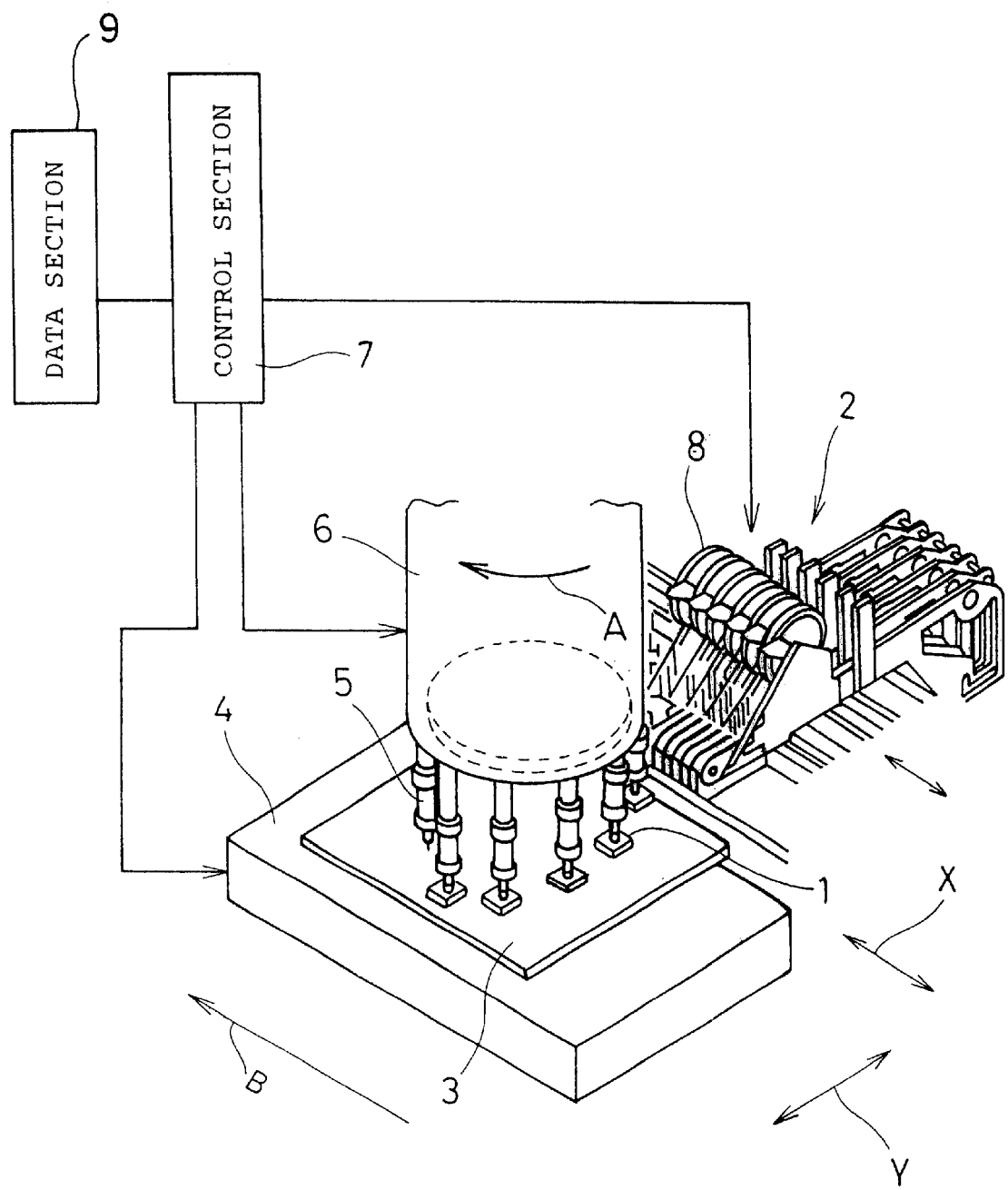
FIG. 1 is a configuration diagram of a component mounting apparatus according to Embodiment 1 of the present invention.

As shown in FIG. 1, the component mounting apparatus of the present invention is configured so that an electronic component 1 supplied from a component supply section 2 is picked up by a suction nozzle 5 attached to a mounting head 6 and mounted on a printed circuit board 3 positioned by a component mounting section 4.

A plurality of suction nozzles 5 are attached to the mounting head 6 in a circular form and rotate in the direction shown by arrow A.

Figure 2:
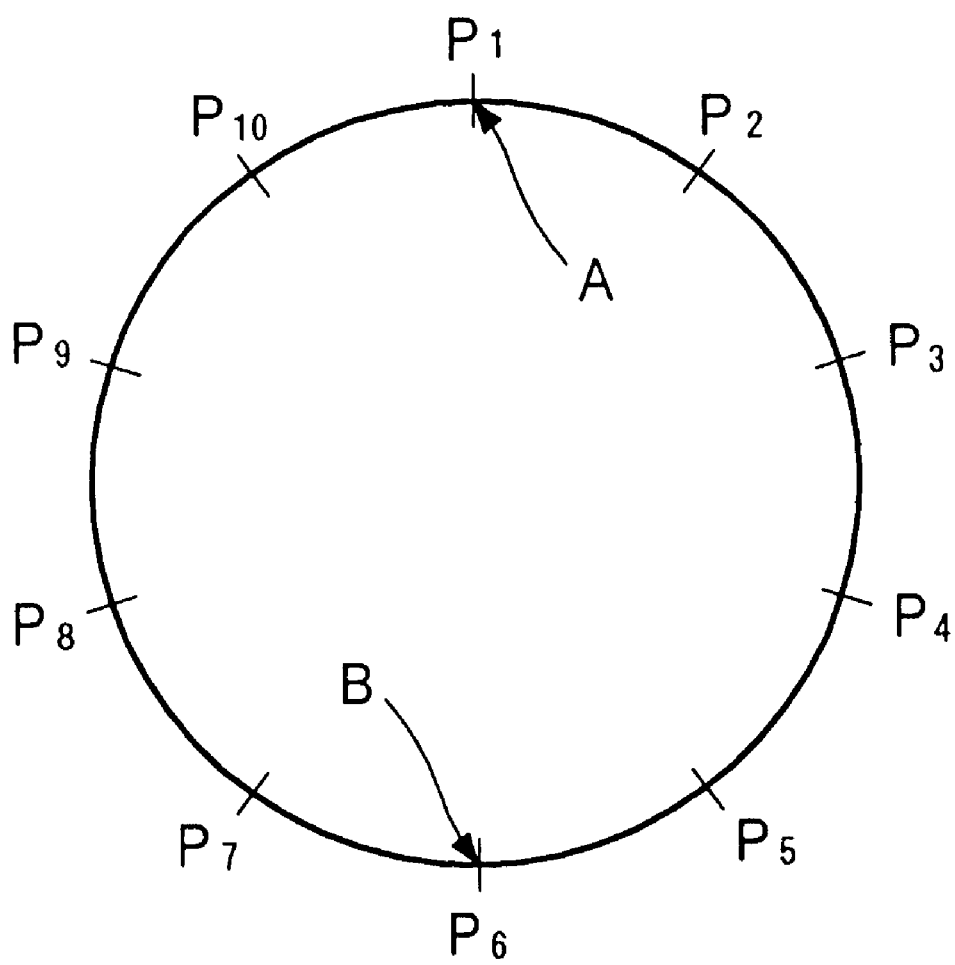
FIG. 2 is a schematic diagram of amounting head according to Embodiment 1 of the present invention.

The component supply section 2 is configured in such a way that a plurality of component supply cassettes 8 housing various kinds of electronic components 1 are placed and the component supply cassettes 8 housing necessary components are moved under the component supply position [position $P_1$ in FIG. 2] of the mounting head 6.

The printed circuit board 3 on which the electronic component 1 is mounted is carried in the direction shown by arrow B and positioned at a predetermined mounting position by the component mounting section 4, which is movable in X and Y directions.

More specifically, as shown in FIG. 2, at the stop positions of the suction nozzles shown by $P_1$ to $P_{11}$, one of the component supply cassettes 8 is positioned at a component suction position A shown by $P_1$ and a necessary electronic component 1 is supplied.

The printed circuit board 3 is positioned at a component suction position B by the component mounting section 4.

The suction nozzle 5, which extends from the mounting head 6 at the component suction position A of $P_1$ and creates suction so that the electronic component 1 is suction-held by the suction nozzle 5, moves to each stop positions $P_1$ to $P_{11}$ sequentially and descends onto the printed circuit board 3 positioned at a component mounting position B of $P_6$ and mounts the electronic component 1 at a predetermined position.

The component mounting apparatus configured as shown above is provided with a data section 9 that previously internally stores information on the height and mounting positions of components to be mounted, and a control section 7 that moves the positions of the suction nozzle 5, mounting head 6 and printed circuit board 3 based on the data supplied from the data section 9.

An example of data stored in the data section 9 is shown in the table below.

| Component | X | Y | θ | a | b | h |
|---|---|---|---|---|---|---|
| A | $X_1$ | $Y_1$ | $\theta_1$ | $a_1$ | $b_1$ | $h_1$ |
| B | $X_2$ | $Y_2$ | $\theta_2$ | $a_2$ | $b_2$ | $h_2$ |
| C | $X_3$ | $Y_3$ | $\theta_3$ | $a_3$ | $b_3$ | $h_3$ |
| D | $X_4$ | $Y_4$ | $\theta_4$ | $a_4$ | $b_4$ | $h_4$ |

Figure 3A:
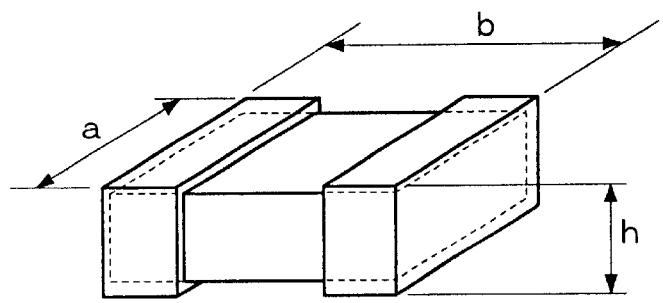
FIG. 3a is a perspective view of a component according to Embodiment 1 of the present invention.
Figure 3B:
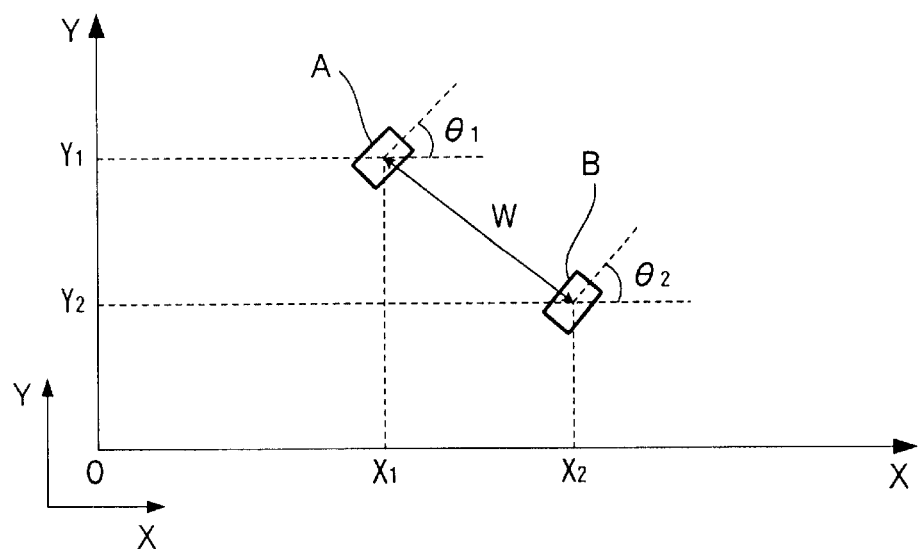
FIGS. 3b and 3c are schematic diagrams respectively illustrating mounting positions and postures of the components, and an inter-component distance between any two of the components.
Figure 3C:
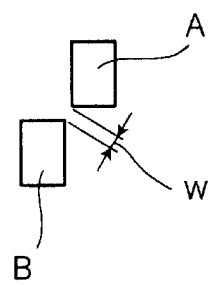

The table above includes the sizes of the components 1, mounting positions with respect to the printed circuit board 3 and data about the mounting posture. That is, A, B, C and D, etc. denote the mounting electronic components 1 and a, b and h denote the width, length and height of each electronic component 1 shown in FIG. 3a, respectively, and X and Y denote the X coordinate and Y coordinate of the mounting position of each electronic component 1 as shown in FIG. 3b, and θ denotes the mounting posture and the angle which the longitudinal direction of the component 1 forms with the X-axis as shown in the figure above. Since inter-component distance W between arbitrary components and gap w can be calculated from the position data (X, Y), posture data (θ) and size data (a, b, h) of the components in the table above, it is also possible to calculate them from the control section 7 on an as-needed basis. However, it is also possible to previously calculate the inter-component distance W between the centers of the component A and the component B and the gap w between the component A and the component B in FIG. 3b and FIG. 3c, and save them as data in the data section 9 apart from the table above.

When mounting the electronic component 1 on the printed circuit board 3, the control section 7 loads the height and mounting positions of the components from information in the data section 9 and decides the mounting order so that the components are mounted in ascending order of height, controls and drives the suction nozzle 5, mounting head 6 and component mounting section 4, etc. and mounts the electronic component 1 on the printed circuit board 3.

Figure 4B:
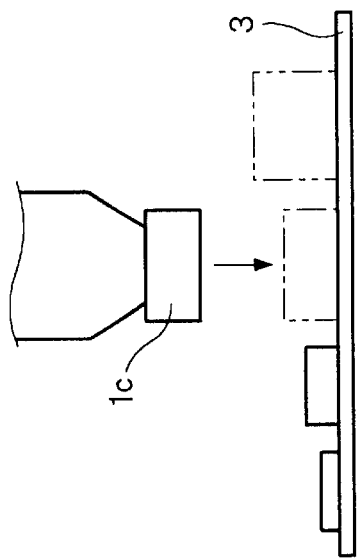
FIGS. 4a to 4d are process charts for mounting components according to Embodiment 1 of the present invention.
Figure 4A:
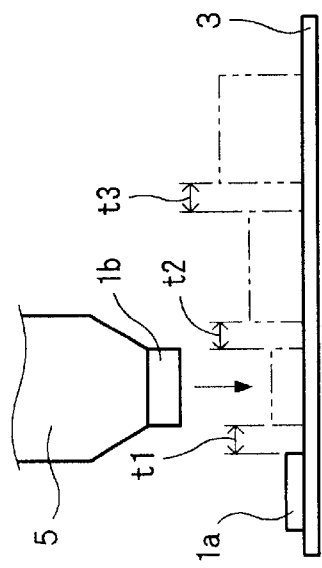
Figure 4D:
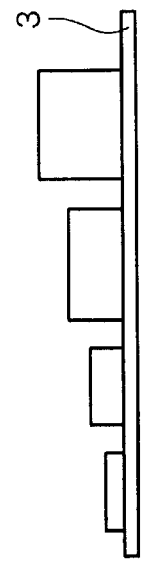

More specifically, as shown in FIG. 4, when the electronic components 1a to 1d are mounted with inter-component distances t1 to t3, respectively, the control section 7 loads the height of each electronic component 1 from information of the data section 9 on the electronic component 1 and starts mounting from the lowest electronic component 1a as shown in FIG. 4a.

Figure 4C:
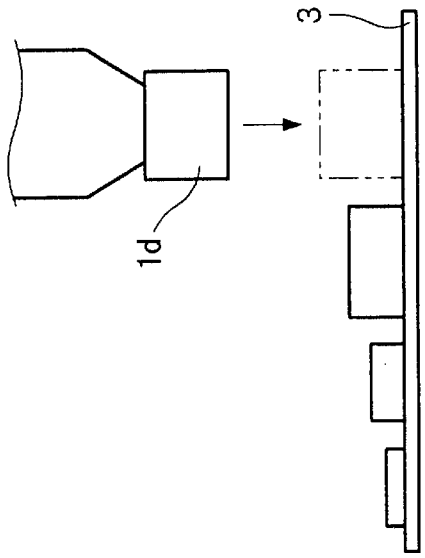

Then, as shown in FIGS. 4b and 4c, the control section 7 mounts the second and third lowest components 1b and 1c. Then, in FIG. 4d, the control section 7 mounts the highest electronic component 1d and finishes mounting of the electronic components 1a to 1d on the printed circuit board 3.

The explanations above describe the case where inter-component distances t1 to t4 are identical, but in the case where the distance between the target electronic components is narrower than a predetermined value, these neighboring components are judged to belong to a same group and mounting starts with the lowest component in this group.

More specifically, as shown in FIG. 5, when four electronic components 1e to 1h are mounted with inter-component distances t4 to t6, the mounting order is decided based on the mounting positions and height given from the information on the electronic components to be mounted 1e to 1h.

In this case, components having narrower inter-component distances than a predetermined value are grouped together with neighboring components and the mounting order is decided such that lower components are mounted first within the group.

Here, suppose that the inter-component distances t4 and t6 are narrower than a predetermined value and inter-component distance 5t is wider than the predetermined value, the neighboring electronic components 1e and 1f, and 1g and 1h, are grouped together, and the lowest component is mounted first within the respective groups.

Therefore, the mounting is effected in the order of electronic components 1e, 1f, 1g and 1h or electronic components 1g, 1h, 1e, and 1f.

Figure 5A:
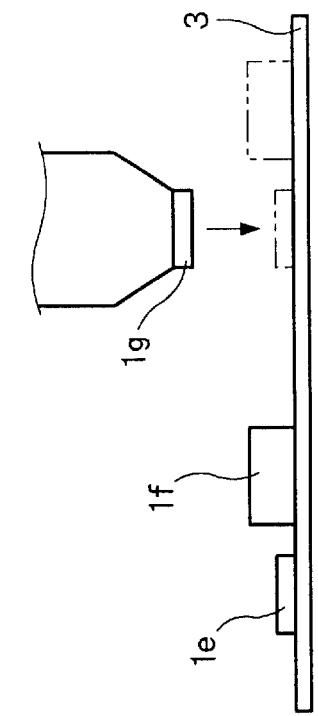
FIGS. 5a to 5d are other process charts for mounting components according to Embodiment 1 of the present invention.
Figure 5B:
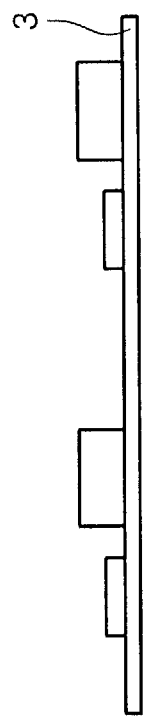
Figure 5C:
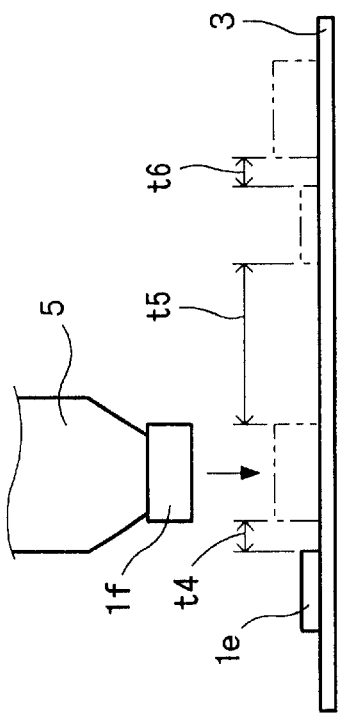
Figure 5D:
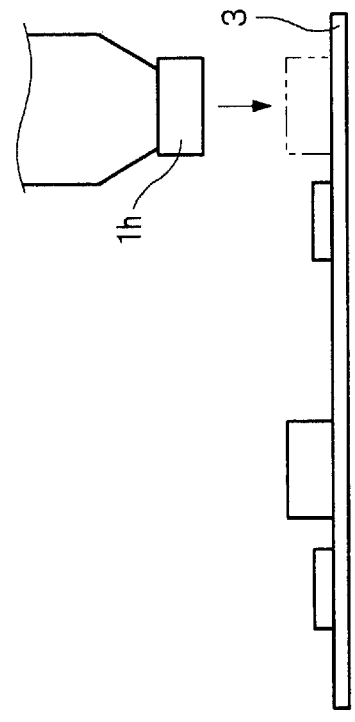

For example, in the case where the mounting is effected in the order of electronic components 1e, 1f, 1g and 1h, as shown in FIG. 5a, the mounting is started with the low electronic component 1e, and then the high component 1f is mounted. When the electronic component 1g is mounted, since there is a sufficient distance t5 between the electronic component 1f and electronic component 1g as shown in FIG. 5b, the electronic component 1g can be mounted without producing interference between the already mounted electronic component 1f and the suction nozzle 5 holding the electronic component 1g or electronic component 1g.

As shown above, by deciding the mounting order so that lower components are mounted first among such components as having a narrower inter-component distance than a predetermined value, it is possible to reduce the amount of movement of the components to be mounted compared to the case where the mounting order is decided so that lower components are mounted first among all components, making it possible to mount the components in a short time.

Moreover, interference between the already mounted components and the suction nozzles or the components held by the suction nozzles is also eliminated, and therefore it is possible to mount micro components on a printed circuit board, with narrow distances between neighboring components. Since the need to reduce the diameter of the suction nozzles is eliminated, it is possible to maintain the strength of the suction nozzles, or to further improve the strength by increasing the diameter.

(Embodiment 2)

The component mounting apparatus described in Embodiment 1 rotates the mounting head 6 having a plurality of suction nozzles 5 around the center axis intermittently, moves the suction nozzles 5 vertically, while controlling the positions of the suction nozzles 5, the mounting head 6 and the printed circuit board 3 using an apparatus for moving the printed circuit board 3 horizontally, so that the components are mounted in ascending order of height. On the other hand, Embodiment 2 describes a component mounting apparatus that moves an XY robot 115 attached with a plurality of suction nozzles 108 horizontally on an XY plane while moving the suction nozzles 108 vertically, and moves a board operating apparatus 140 holding the printed circuit board 3 horizontally. Embodiment 2 also describes a component mounting apparatus without the board operating apparatus 140, that operates only the XY robot 115 and the suction nozzles 108 to mount components in ascending order of height.

Figure 6:
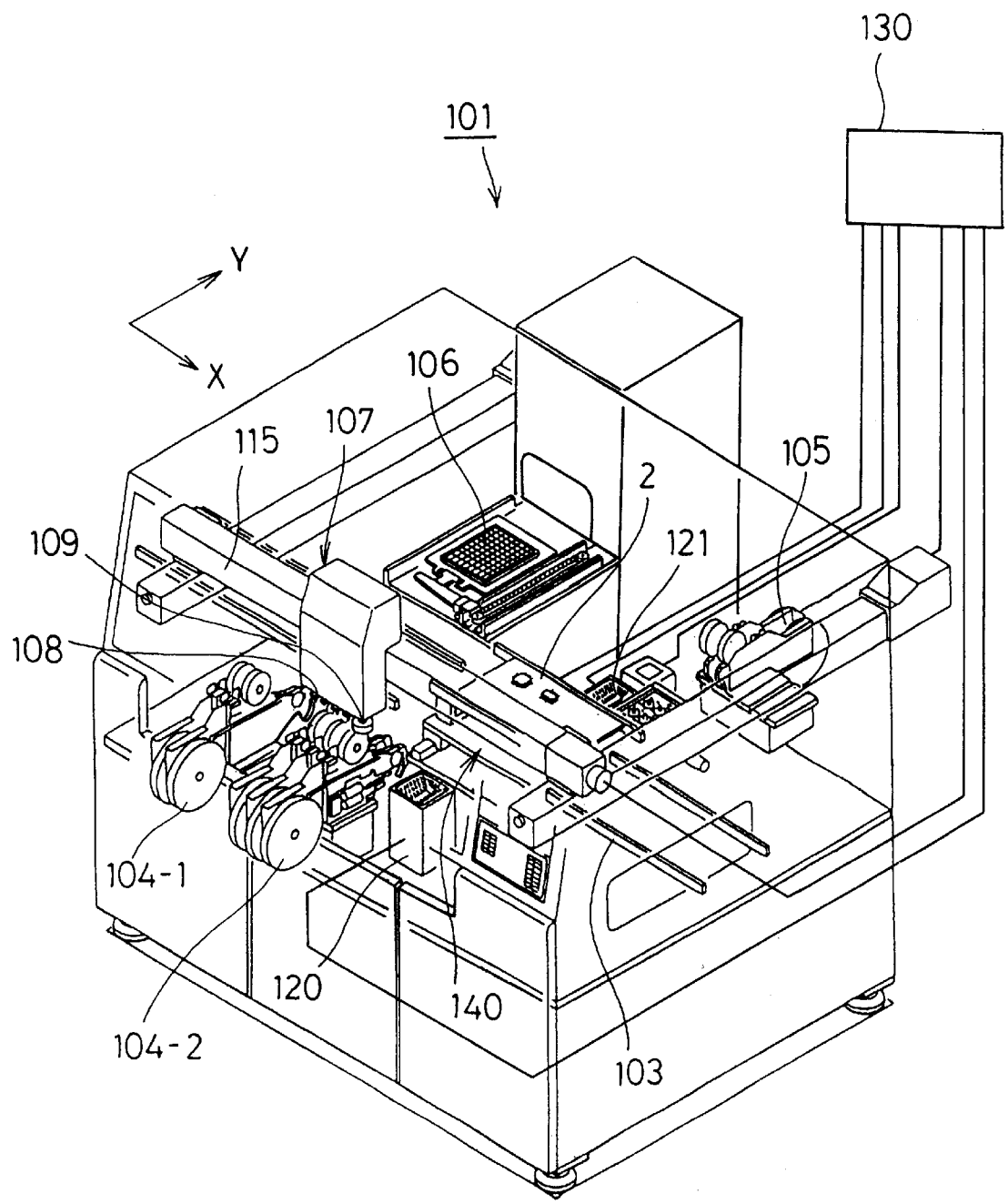
FIG. 6 is a configuration diagram of component mounting apparatus according to Embodiment 2 of the present invention.

The component mounting apparatus 101 according to this embodiment as shown in FIG. 6 comprises: a board transport apparatus 103 that carries in and out the printed circuit board 3; a board operating apparatus 140 that can be connected to the board transport apparatus 103 and holds and moves the printed circuit board 3 in X and Y directions during a component mounting operation; reel-type electronic component supply apparatuses 104-1, 104-2 and 105 or a tray-type electronic component supply apparatus 106 accommodating electronic components 1 to be mounted on the printing circuit board 3; a mounting head 107 having nozzles 108 for holding electronic components from these electronic component supply apparatuses, for example, by suction operation, and for mounting the components being held by the nozzles at the mounting positions on the printed circuit board 3; the XY robot 115 for moving the mounting head 107 in X and Y directions; recognition apparatuses 120 and 121 for photographing and measuring the holding posture of the electronic components held by the mounting head 107; and a control apparatus 130 for controlling movements of at least the XY robot 115 and the board operating apparatus 140 and performing recognition processing of images supplied from the recognition apparatuses 120 and 121, thereby to correct a difference between the above measured holding posture and the mounting posture of the corresponding component on the printed circuit board 3.

Furthermore, the mounting head 107 in this embodiment has four nozzles 108 and a board recognition camera 109 that recognizes a board position detection mark on the board 3. In this embodiment, after all the four nozzles 108 have held components, the components held by the nozzles are mounted on the printed circuit board 3 one by one. In order to obtain information for correction of the amount of movement when components are mounted by the mounting head 107, the board recognition camera 109 photographs the above geometric board position detection mark formed on the printed circuit board 3 so that the position after movement of the printed circuit board 3 moved by the board operating apparatus 140 is detected correctly.

Figure 7:
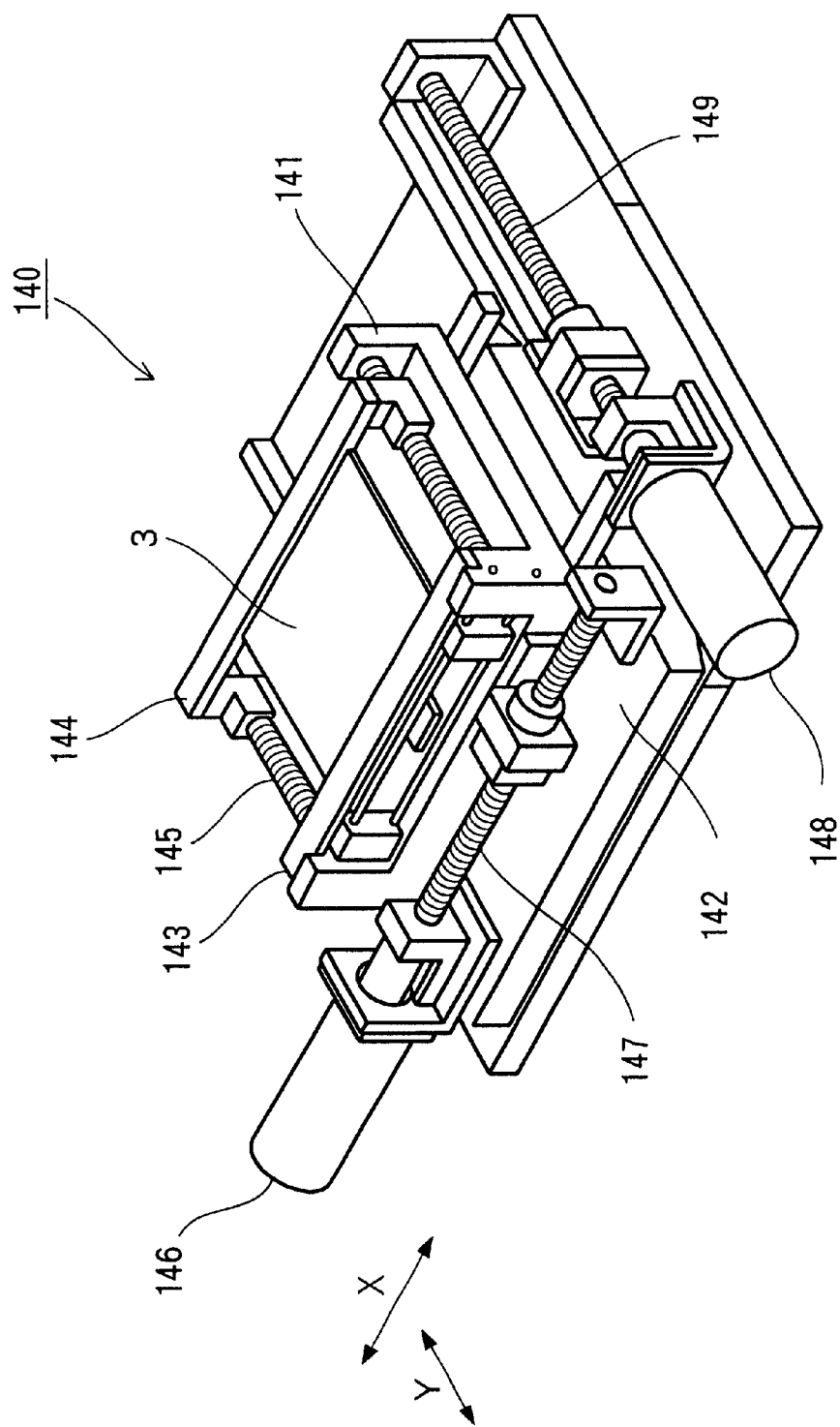
FIG. 7 is an enlarged perspective view illustrating a principal part of FIG. 6.

The board operating apparatus 140 includes an X table 141 and a Y table 142 as shown in FIG. 7. The X table 141 includes a holding mechanism 145 for holding the printed circuit board 3 by sandwiching it between a fixed-side holding plate 143 and a movable-side holding plate 144 and can move in X direction via a ball screw 147 driven by a motor 146. The Y table 142 on which the above X table 141 is mounted can move in Y direction via a ball screw 149 driven by a motor 148. Here, the fixed-side holding plate 143 and the movable-side holding plate 144 are connected to the board transport apparatus 103 and the printed circuit board 3 transported via the board transport apparatus 103 is sandwiched between the fixed-side holding plate 143 and the movable-side holding plate 144. In this way, the board operating apparatus 140 allows a printed circuit board to move in the X and Y directions during component mounting.

The operation of the component mounting apparatus 101 configured as shown above will be explained below.

First, the control apparatus 130 is supplied with mounting position data, supply position data and board mark detection data.

On the other hand, the printed circuit board 3 is carried into the component mounting apparatus 101 by the board transport apparatus 103 and held by the board operating apparatus 140.

Under such a condition, in order to perform the above described board mark detection operation at a position nearest to either the recognition apparatus 120 or 121 which photographs the holding posture of a component to be mounted according to this embodiment, the control apparatus 130 first moves the board operating apparatus 140 to a place nearest to a component supply location such as the component supply apparatus 104 that supplies components to be mounted. During mounting of components, since the component held by the mounting head 107 is then placed above the recognition apparatus 120 or recognition apparatus 121 for component recognition processing, in order to minimize the distance of movement of the mounting head 107 from the recognition apparatus 120 or recognition apparatus 121 to the component mounting position on the printed circuit board 3, the control apparatus 130 moves the board operating apparatus 140 so that the above described component mounting position comes closest to the recognition apparatus 120 or recognition apparatus 121 on the side of the component supply apparatus 104 which supplies components to be mounted.

After the control apparatus 130 moves the board operating apparatus 140 in this way, the control apparatus 130 operates the XY robot 115 and the nozzle 108 to suck a predetermined component from the component supply apparatuses 104, 105, 106, and further operates the XY robot 115 and the nozzle 108 to mount the component at a predetermined position on the printed circuit board 3. This mounting order is decided taking into account the height of components and the distance between the components as explained in Embodiment 1.

The above explanation describes the case where the board operating apparatus 140 is provided, but there is also a simple component mounting apparatus 101 without this board operating apparatus 140, though not shown in the figure, and in this case, immediately after the printed circuit board 3 is carried into the component mounting apparatus 101 by the board transport apparatus 103, the component mounting apparatus 101 mounts a predetermined component at a predetermined position on the fixed printed circuit board by operating the XY robot 115 and the nozzle 108. The mounting order at this time is the same as that in Embodiment 1.

(Embodiment 3)

Figure 8A:
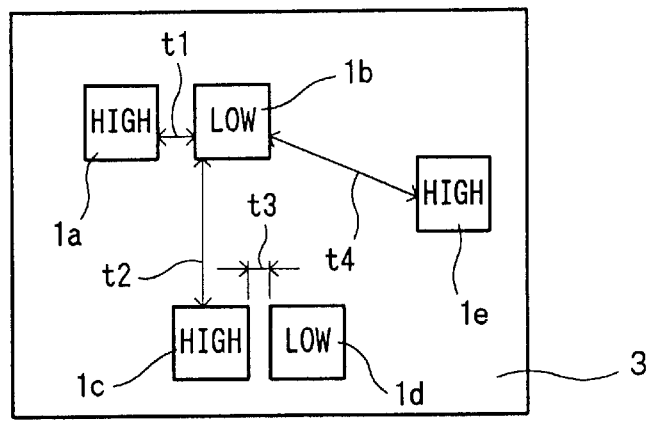
FIGS. 8a to 8c are process charts to decide an order of mounting components according to Embodiment 3 of the present invention.
Figure 8B:
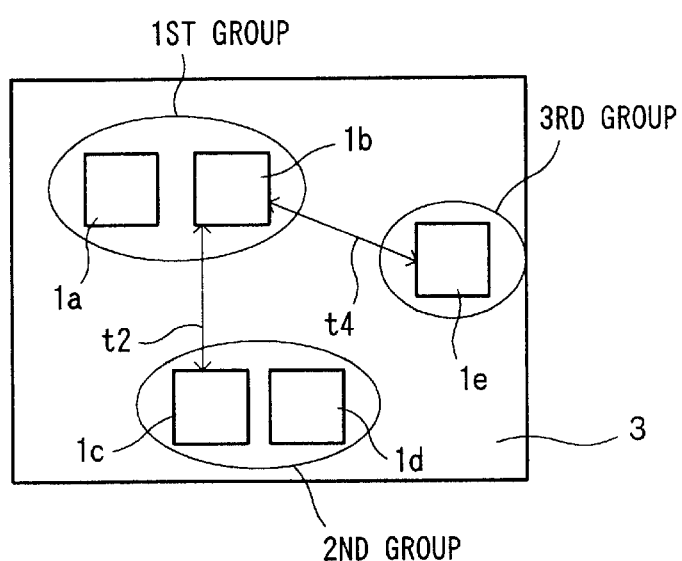
Figure 8C:
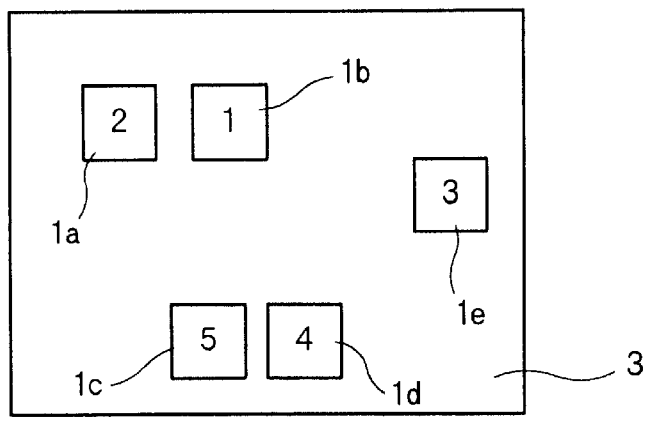
Figure 9:
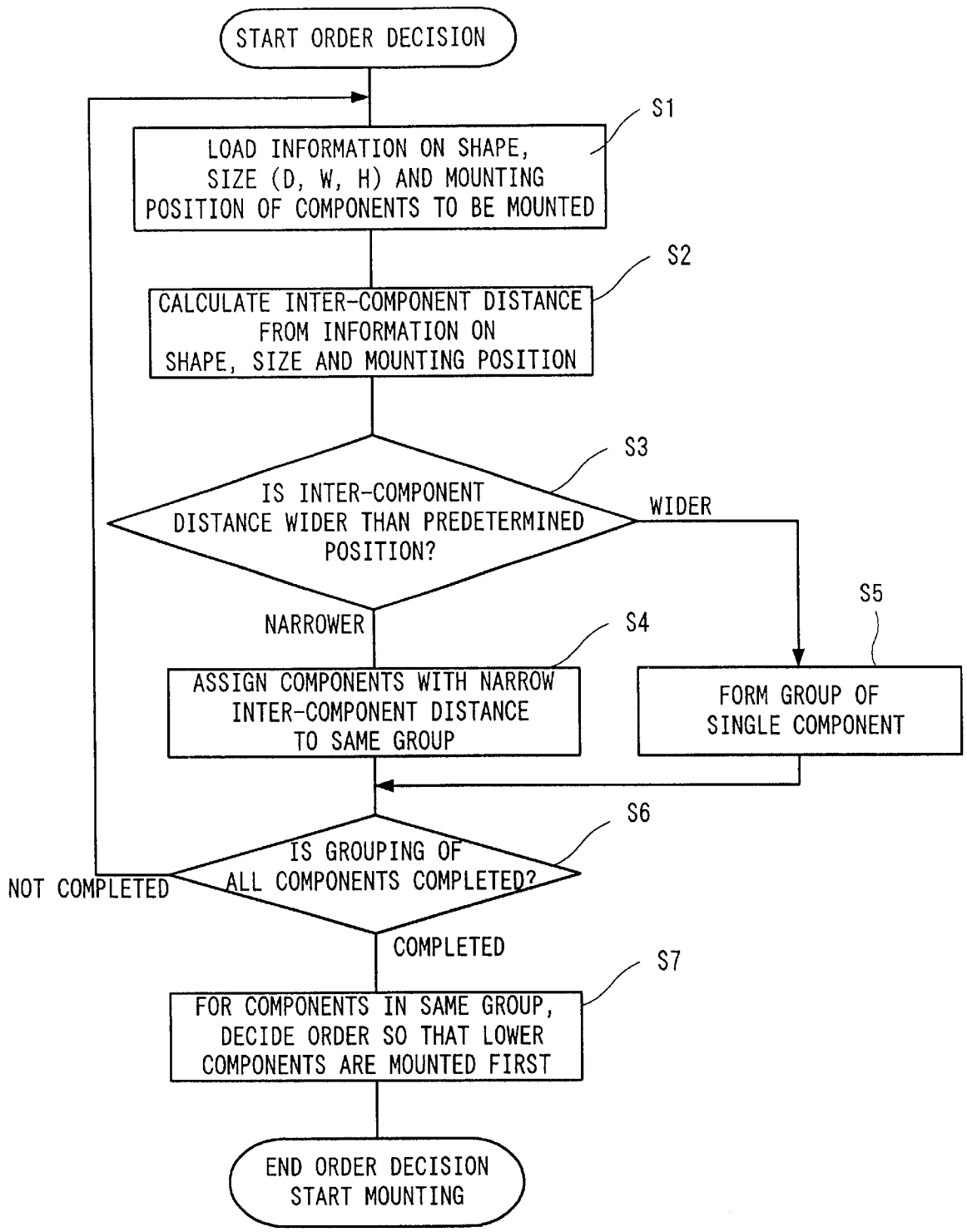
FIG. 9 is a flow chart of a component mounting method according to Embodiment 3 of the present invention.

FIG. 8 and FIG. 9 show Embodiment 3 of the present invention.

Based on a specific example shown in FIG. 8, the flow chart in FIG. 9 will be explained.

As shown in FIG. 8a, when higher electronic components 1a, 1c and 1e and lower electronic components 1b and 1d are mounted on a printed circuit board 3, the order of mounting the electronic components 1a to 1e will be decided first.

As shown in FIG. 9, in step S1, information on the shape, size and mounting position is loaded from the information on the electronic components 1a to 1e.

In step S2, inter-component distances t1 to t4 of the mounted components are calculated from the information loaded.

In step S3, it is decided whether inter-component distances t1 to t4 are wider than a predetermined value or not.

When it is decided that the inter-component distances are narrower than the predetermined value, components with narrow inter-component distances are assigned to a same group in step 4. Since inter-component distances t1 and t3 are narrower than the predetermined value, the electronic components 1a and 1b are classified as a first group and the electronic components 1c and 1d are classified as a second group. In this way, components with a narrow inter-component distance are grouped together as shown in FIG. 8b.

When it is decided that inter-component distances are wider than the predetermined value, a different group is formed in step S5. Here, since inter-component distances t2 and t4 are wider than the predetermined value, a third group is formed only composed of the electronic component 1e.

In step S6, it is checked whether all grouping is completed or not.

If all grouping is completed, in step S7, the mounting order is decided in each group so that lower components are mounted first. Here, the mounting order is decided as shown in FIG. 8c, in the order of the electronic components 1b, 1a in the first group and the electronic components 1d, 1c in the second group.

By the way, the distance t2 between the first group and the second group is wider than the distance t4 between the first group and the third group, and therefore the components of the third group are mounted after the mounting of the first group is completed, then followed by component mounting of the second group.

Therefore, the mounting order of the electronic components 1a to 1e is 1b, 1a, 1e, 1d and 1c as shown in FIG. 8c. Mounting of the components is started according to this mounting order.

Here, in the case where grouping is not completed in step S6, the process goes back to step S1 and the above operations will be repeated for other components.

Such a configuration can prevent distances of movements of components to be mounted from becoming longer than necessary and finish entire mounting in a short time.

(Embodiment 4)

Figure 10A:
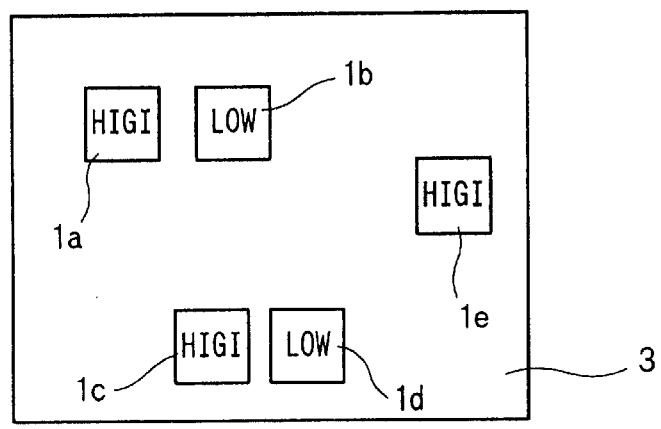
FIGS. 10a to 10c are process charts to decide an order of mounting components according to Embodiment 4 of the present invention.
Figure 10B:
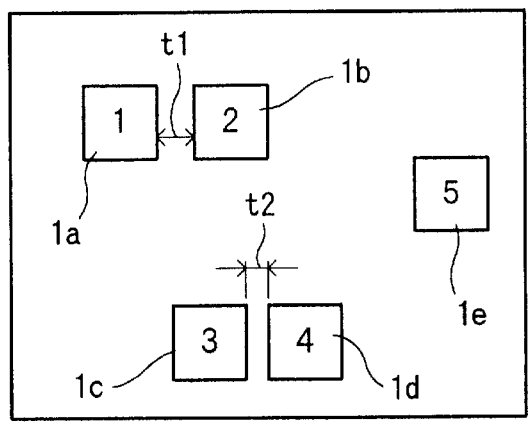
Figure 10C:
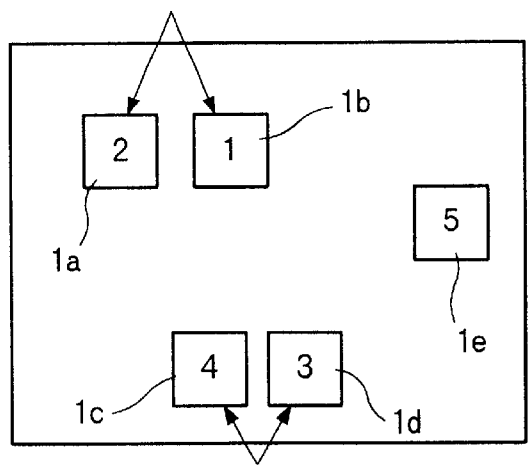
Figure 11:
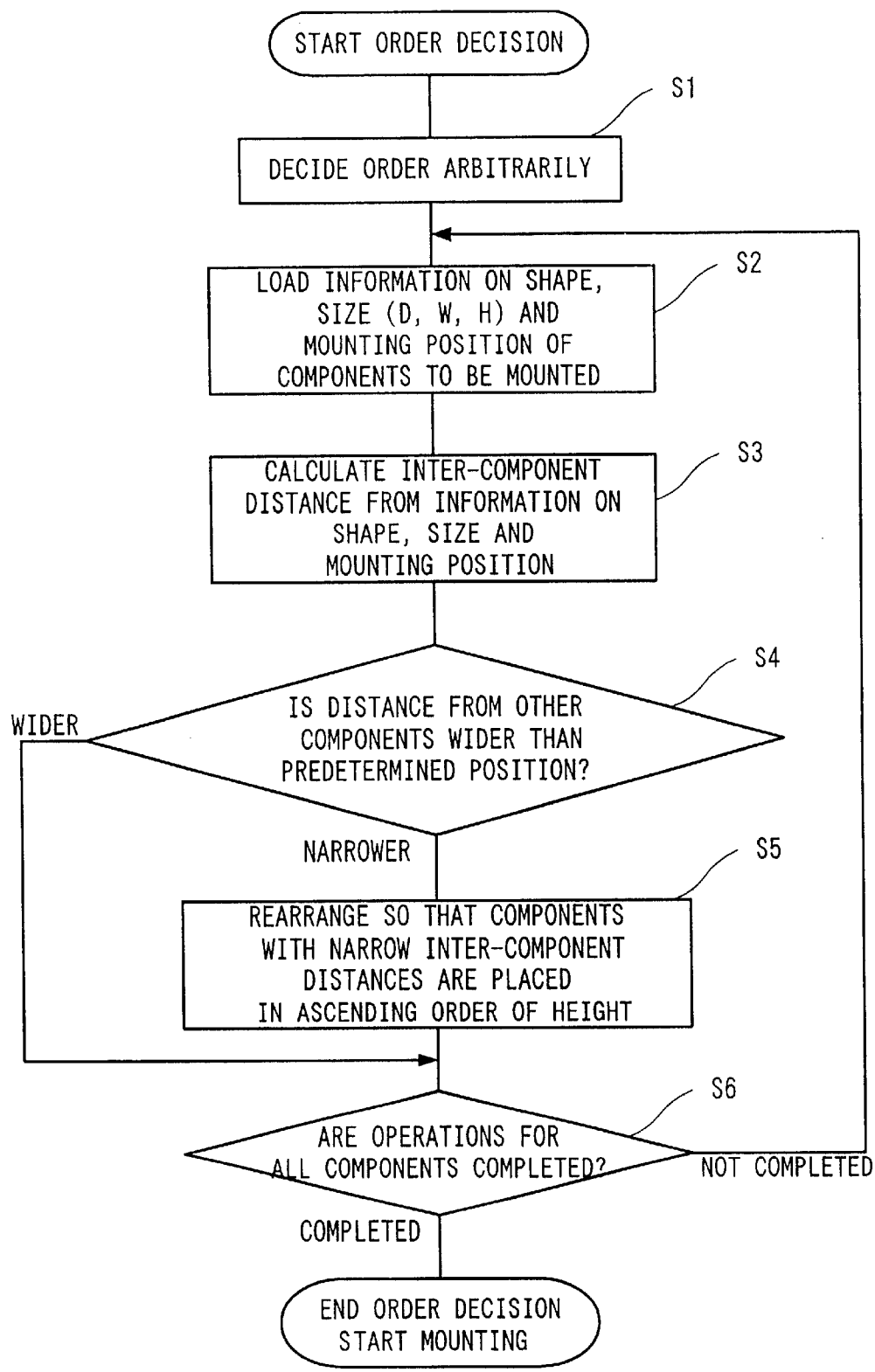
FIG. 11 is a flow chart of a component mounting method according to Embodiment 4 of the present invention.

FIG. 10 and FIG. 11 show Embodiment 4 of the present invention.

Based on a, specific example shown in FIG. 10, the flow chart in FIG. 11 will be explained.

As shown in FIG. 10a, when higher electronic components 1a, 1c and 1e and lower electronic components 1b and 1d are mounted on a printed circuit board 3, the order of mounting the electronic components 1a to 1e will be decided first.

As shown in FIG. 11, in step S1, the order of mounting the electronic components to be mounted 1a to 1e is decided according to a conventional method such as a method of minimizing the mounting time using the mounting positions, etc. Here, the mounting order is assumed to be electronic components 1a, 1b, 1c, 1d and 1e as shown in FIG. 10b.

In step S2, information on the shape, size and mounting position is loaded from the information on the electronic components 1a to 1e.

In step S3, inter-component distances t1 and t2 of the mounted components are calculated from the information loaded.

In step S4, it is decided whether inter-component distances t1 and t2 are wider than a predetermined value or not.

When it is decided that the inter-component distances are narrower than the predetermined value, components with narrow inter-component distances are rearranged in ascending order of height in step 5. Since inter-component distances t1 and t2 are narrower than the predetermined value, the electronic components are rearranged so that the mounting order is 1b, 1a, 1d, 1c and 1e as shown in FIG. 10c.

When it is decided that inter-component distances are wider than the predetermined value in step S4, no rearrangement is performed.

In step S6, it is checked whether operation for all components is completed or not. If operation for all components is completed, component mounting is started according to the mounting order decided above. If operation for all components is not completed, the process goes back to step S2 and the above operation will be repeated for other components.

Such a configuration can also produce the same effect as that in Embodiment 3 above.

(Embodiment 5)

When mounting of the electronic components 1 on the printed circuit board 3 is started according to the mounting order decided according to Embodiments 3 and 4 above, mounting of high components in this Embodiment 5 is started after confirming that mounting of lower components is completed.

Figure 12:
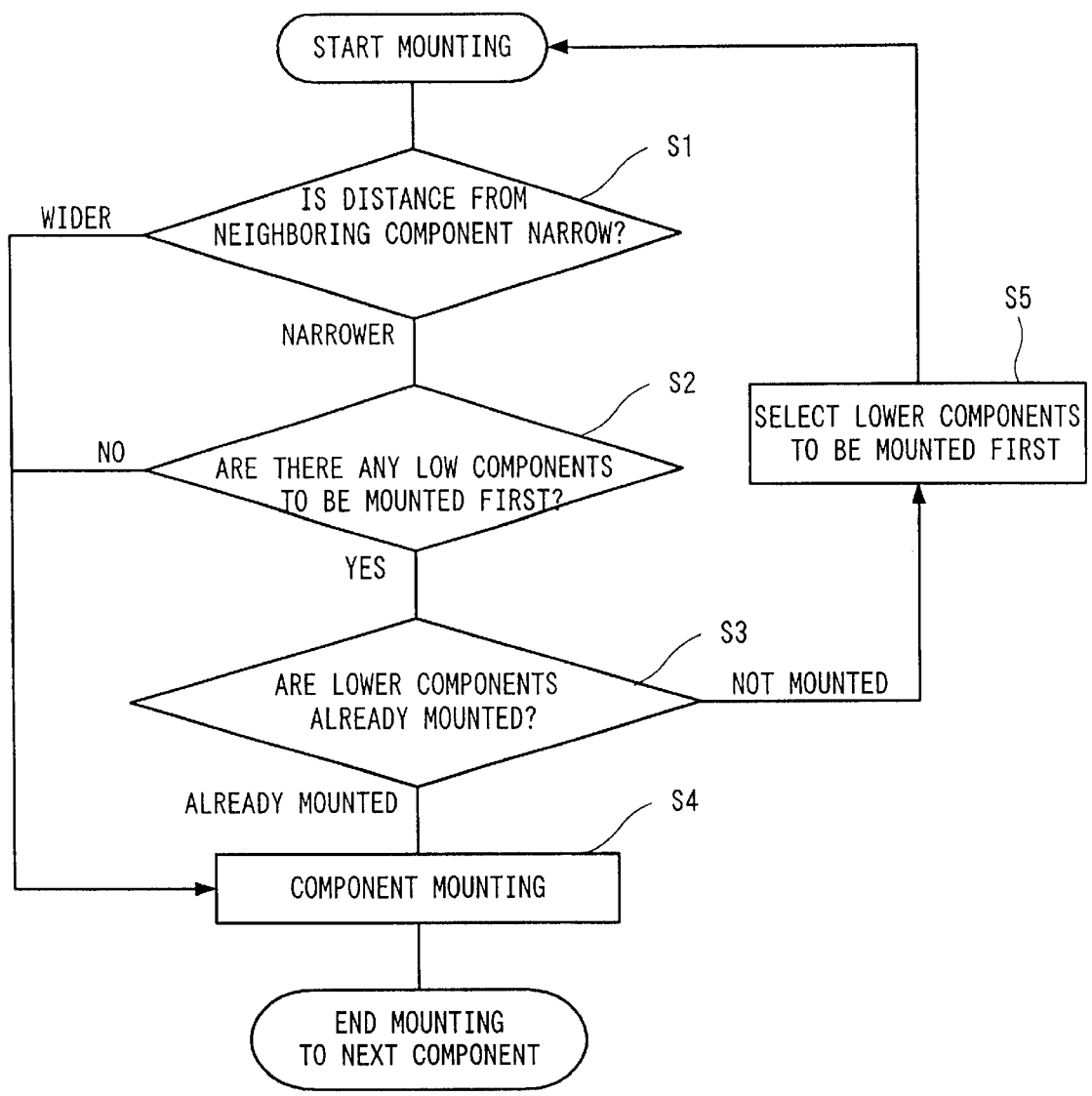
FIG. 12 is a flow chart of a component mounting method according to Embodiment 5 of the present invention.

FIG. 12 shows Embodiment 5 of the present invention.

Before starting mounting of electronic components, in step S1, it is decided whether distances from other components are narrower than a predetermined value or not.

If it is decided that distances from other components are narrower than a predetermined value, in step S2, it is decided whether there are any lower components that should be mounted first.

If there are components that should be mounted first, in step S3, it is decided whether mounting of the lower components is completed or not.

If it is decided that mounting of the lower components is completed, the components are mounted in step S4 and after the mounting is completed, mounting of the next components will be started.

If it is decided that mounting of the lower components is not completed in step S3, that is, if those components remain unmounted due to some trouble such as a suction error, components to be mounted are selected again so that the unmounted components are mounted and the process goes back to the beginning of the flow chart.

If, in step S1, it is decided that distances from neighboring components are wide or there are no lower components that should be mounted first in step S2, that is, if the component to be mounted next is the lowest among neighboring components, the component is mounted in step S4.

This procedure corresponds to a case, for example, as shown in FIG. 5a, where upon mounting the electronic component 1f, the mounting of the electronic component 1e is not completed due to a suction error or the like, and the electronic component 1e is remounted first and the electronic component 1f is then mounted.

The embodiments above describe the examples of mounting electronic components at predetermined places on a printed circuit board and manufacturing an electronic circuit board, but the present invention is not limited to these and is also applicable to various component mounting apparatuses in general that mount various components on various mounting targets.

What is claimed is:

1. A component mounting apparatus for mounting components of a set of components in ascending order of height, comprising:

a mounting head;

at least one suction nozzle attached to the mounting head; and a data section for storing information relating to components to be mounted;

a mounting section for changing positions of said at least one suction nozzle, the mounting head and a printed circuit board; and a control section connected to the data section and the mounting section for providing control signals to said mounting section, said control section for controlling a mounting sequence such that mounting of a first component of the set of components does not commence until completion of mounting of all components of the set of components having a height lower than the first component of the set of components, so that all components of the set of components to be mounted are mounted in ascending order of height.

2. A component mounting apparatus for mounting components of a set of components in ascending order of height, comprising:

a component supply section for supplying a set of components to be mounted;

a mounting head having at least one suction nozzle for picking up components from said component supply section and mounting the components on a printed circuit board;

a data section for storing information relating to components to be mounted;

a mounting section comprising for changing positions of said at least one suction nozzle, the mounting head and a printed circuit board;

a control section connected to the data section and the mounting section for providing control signals to said mounting section for controlling a mounting sequence such that mounting of a first component of the set of components does not commence until completion of mounting of all components of the set of components having a height lower than the first component, wherein positions of the at least one suction nozzle, the mounting head and the printed circuit board are driven and controlled so that all components of the set of components are mounted in ascending order of height based on height data relating to the set of components to be mounted, said height data being supplied from said data section.

3. A component mounting apparatus for mounting components of a set of components in ascending order of height, comprising:

a component supply section for supplying a set of components to be mounted;

a mounting head having at least one suction nozzle located in a circular pattern for picking up components from said component supply section and mounting components on a printed circuit board;

a data section for storing information relating to components to be mounted;

a mounting section comprising for changing positions of said at least one suction nozzle, the mounting head and a printed circuit board;

a control section for connected to the data section and the mounting section for providing control signals to said mounting section for controlling vertical movements of said suction nozzles means, intermittent rotations of the mounting head and horizontal movements of the component mounting section, and for controlling a mounting sequence such that mounting of a first component of the set of components does not commence until completion of mounting of all components of the set of components having a height lower than the first component, wherein movements of the at least one suction nozzle, the mounting head and a printed circuit board are driven and controlled so that all components of the set of components are mounted in ascending order of height based on height data relating to components to be mounted, said height data being supplied from said data section.

4. A component mounting apparatus for picking up each of a set of components supplied from a component supply section by at least one suction nozzle attached to a mounting head and mounting the components on a printed circuit board, said apparatus for mounting components of a set of components in ascending order of height, comprising:

a mounting section comprising changing positions of at least one suction nozzle, a mounting head and a printed circuit board;

a control section connected to the mounting section for deciding an order of mounting, based on information relating to mounting positions and heights of the components to be mounted, so that the components are mounted in ascending order of height, wherein mounting of a first component of the set of components does not commence until completion of mounting of all components of the set of components having a height lower than said first component.

\* \* \* \* \*